United States Patent
Huang et al.

(10) Patent No.: US 10,157,857 B2
(45) Date of Patent: Dec. 18, 2018

(54) METHODS FOR FABRICATING SEMICONDUCTOR SHIELDING STRUCTURES

(71) Applicant: EVERSPIN TECHNOLOGIES, INC., Chandler, AZ (US)

(72) Inventors: De Jun Huang, Shenzhen (CN); Quan Bang Li, Gilbert, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

(21) Appl. No.: 15/845,256

(22) Filed: Dec. 18, 2017

(65) Prior Publication Data

US 2018/0182714 A1 Jun. 28, 2018

Related U.S. Application Data

(60) Provisional application No. 62/438,062, filed on Dec. 22, 2016.

(51) Int. Cl.
| | |
|---|---|
| *H01L 23/552* | (2006.01) |
| *H01L 49/02* | (2006.01) |
| *H01L 21/56* | (2006.01) |
| *H01L 21/28* | (2006.01) |
| *G11C 17/08* | (2006.01) |
| *H01L 23/13* | (2006.01) |
| *H01L 23/00* | (2006.01) |
| *H05K 1/02* | (2006.01) |

(Continued)

(52) U.S. Cl.
CPC ........ *H01L 23/552* (2013.01); *G11C 16/0433* (2013.01); *G11C 17/08* (2013.01); *H01L 21/28273* (2013.01); *H01L 21/561* (2013.01); *H01L 23/13* (2013.01); *H01L 23/28* (2013.01); *H01L 24/97* (2013.01); *H01L 49/02* (2013.01); *H05K 1/0237* (2013.01)

(58) Field of Classification Search
None
See application file for complete search history.

(56) References Cited

U.S. PATENT DOCUMENTS

| | | | |
|---|---|---|---|
| 8,415,775 B2 * | 4/2013 | Katti | ........................ H01L 23/13 257/659 |
| 9,956,163 B2 * | 5/2018 | Boland | .................... A61K 8/99 |

(Continued)

*Primary Examiner* — Bradley K Smith

(74) *Attorney, Agent, or Firm* — Bookoff McAndrews, PLLC

(57) ABSTRACT

The present disclosure is drawn to, among other things, a method of forming a semiconductor shield from a stock material having a thickness. In some aspects the methods includes providing a first layer of material on a first surface of the stock material, wherein at least a portion of the first layer of material includes a first window that exposes a portion of the first surface; providing a second layer of material on a second surface of the stock material, wherein the second surface of the stock material is spaced from the first surface by the thickness of the stock material, and wherein at least portion of the second layer of material includes a second window that exposes a portion of the second surface; and selectively removing a portion of the stock material exposed at the first or second windows, wherein the portion removed includes less than an entirety of the thickness of the stock material.

20 Claims, 6 Drawing Sheets

(51) Int. Cl.
*G11C 16/04* (2006.01)
*H01L 23/28* (2006.01)

(56) References Cited

U.S. PATENT DOCUMENTS

2008/0266938 A1* 10/2008 Molla ................ G11C 5/02
                                                  365/158
2014/0197505 A1*  7/2014 Zhou ................ H01L 23/552
                                                  257/422

* cited by examiner

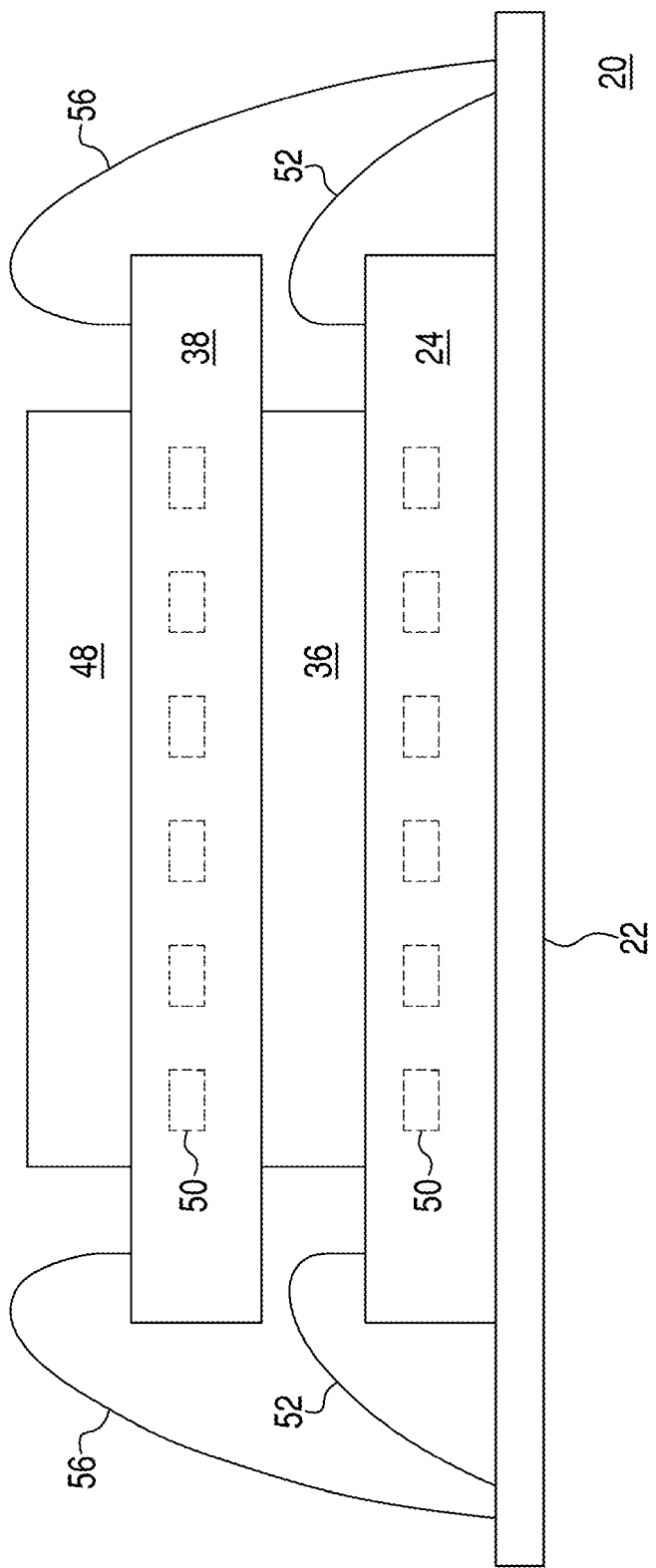

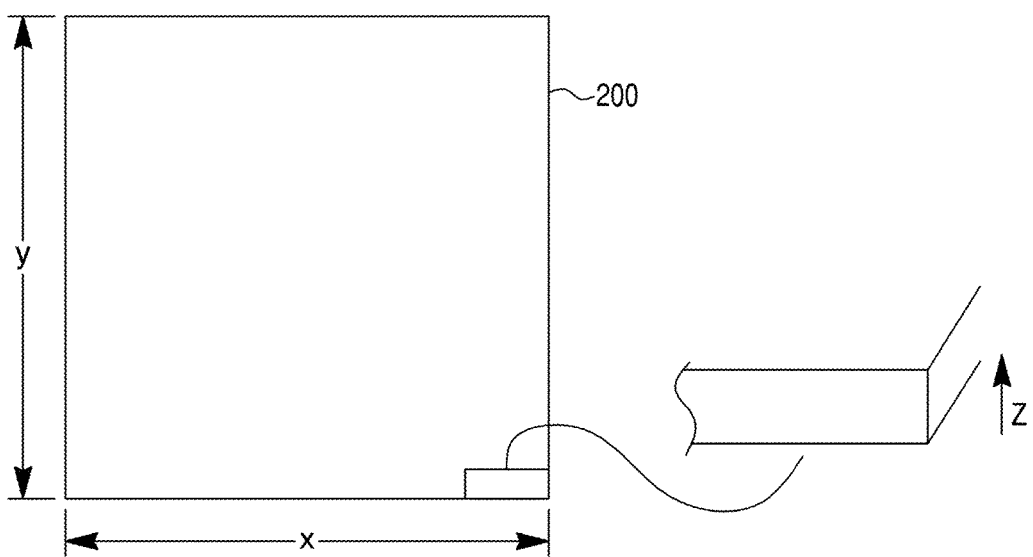

METHODS FOR FABRICATING SEMICONDUCTOR SHIELDING STRUCTURES

CROSS-REFERENCE TO RELATED APPLICATIONS

This application claims the benefit of priority from U.S. Provisional Application No. 62/438,062, filed on Dec. 22, 2016, which is incorporated by reference herein in its entirety.

TECHNICAL FIELD

Embodiments of the present disclosure relate to shielding structures (e.g., shields) for semiconductor devices. More specifically, embodiments of the present disclosure relate to manufacturing processes for shields for semiconductor devices having magnetically sensitive materials.

INTRODUCTION

Magnetic materials are used in, e.g., magnetic memory (e.g., Magnetoresistive Random Access Memory (MRAM)) and magnetic sensors. MRAM is a non-volatile computer memory technology that stores data in magnetoresistive elements. A magnetoresistive element may include a structure having multiple magnetic layers separated by one or more non-magnetic layers. The magnetic layers may have magnetic orientations that are fixed or free to switch between one of two directions. In general, data storage is accomplished by applying an electrical current to change a magnetic orientation of a magnetic layer having a switchable orientation.

The orientations of the magnetic layers in a magnetoresistive element, however, may be affected by external (or stray) magnetic fields. That is, an external magnetic field of sufficient magnitude could cause errors in memory retention. As a result, operation of the magnetoresistive element may be compromised. External or stray magnetic fields can come from any number of sources. For example, in an MRAM with a high density of magnetoresistive elements, an external field may come from a neighboring magnetoresistive element. Other unwanted external fields can be caused by local, severe thunderstorms or improperly grounded power cable systems.

BRIEF DESCRIPTION OF THE DRAWINGS

In the course of the detailed description that follows, reference will be made to the appended drawings. The drawings show different aspects of the present disclosure and, where appropriate, reference numerals illustrating like structures, components, materials and/or elements in different figures are labeled similarly. It is understood that various combinations of the structures, components, and/or elements, other than those specifically shown, are contemplated and are within the scope of the present disclosure.

Moreover, there are many embodiments of the present disclosure described and illustrated herein. The present disclosure is neither limited to any single aspect nor embodiment thereof, nor to any combinations and/or permutations of such aspects and/or embodiments. Moreover, each of the aspects of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein.

FIG. 1 depicts a side view of a semiconductor device having one or more magnetoresistive elements, according to one aspect of the present disclosure.

FIG. 2 depicts a plan view of a sheet of stock material from which magnetic shields may be formed, according to another aspect of the present disclosure.

Figure 3A:
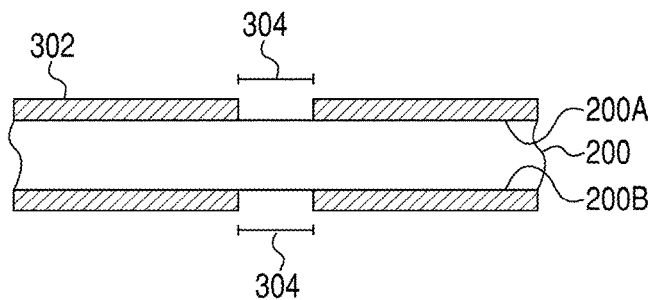
FIGS. 3A-3H illustrate steps of an exemplary manufacturing process for producing singulated magnetic shields from a sheet of stock material, according to aspects of the present disclosure.

Again, there are many embodiments described and illustrated herein. The present disclosure is neither limited to any single aspect nor embodiment thereof, nor to any combinations and/or permutations of such aspects and/or embodiments. Each of the aspects of the present disclosure, and/or embodiments thereof, may be employed alone or in combination with one or more of the other aspects of the present disclosure and/or embodiments thereof. For the sake of brevity, many of those combinations and permutations are not discussed separately herein.

As used herein, the terms "comprises," "comprising," or any other variation thereof, are intended to cover a non-exclusive inclusion, such that a process, method, article, or apparatus that comprises a list of elements does not include only those elements, but may include other elements not expressly listed or inherent to such process, method, article, or apparatus. The term "exemplary" is used in the sense of "example," rather than "ideal."

DETAILED DESCRIPTION

Detailed illustrative aspects are disclosed herein. However, specific structural and functional details disclosed herein are merely representative for purposes of describing example embodiments of the present disclosure. The present disclosure may be embodied in many alternate forms and should not be construed as limited to only the embodiments set forth herein. Further, the terminology used herein is for the purpose of describing particular embodiments only and is not intended to be limiting of exemplary embodiments described herein.

When the specification makes reference to "one embodiment" or to "an embodiment," it is intended to mean that a particular feature, structure, characteristic, or function described in connection with the embodiment being discussed is included in at least one contemplated embodiment of the present disclosure. Thus, the appearance of the phrases, "in one embodiment" or "in an embodiment," in different places in the specification does not constitute a plurality of references to a single embodiment of the present disclosure.

As used herein, the singular forms "a," "an," and "the" are intended to include the plural forms as well, unless the context clearly indicates otherwise. It also should be noted that in some alternative implementations, the features and/or steps described may occur out of the order depicted in the figures or discussed herein. For example, two steps or figures shown in succession may instead be executed substantially concurrently or may sometimes be executed in the reverse order, depending upon the functionality/acts involved.

In one aspect, the present disclosure is directed to a manufacturing process for producing shields for protecting a magnetoresistive element from an external or stray magnetic field.

With reference now to FIG. 1, there is depicted a side view of a semiconductor device 20 having one or more exemplary magnetic shields integrated therein. Semiconductor device 20 may include die 24 coupled to a die pad 22. Die 24 may include one or more magnetically sensitive circuits, such as, e.g., magnetoresistive elements 50, that may be sensitive to external magnetic fields. For example, die 24 may be a magnetoresistive memory device having an array of magnetic memory cells, such as, e.g., an MRAM chip having an array of spin torque and/or magnetic tunnel junction ("MTJ") bits (not shown). The magnetoresistive elements 50 (e.g., ST-MRAM) may be magnetic tunnel barrier stacks/structures having, for example, perpendicular or in-plane anisotropy.

Semiconductor device 20 may utilize a stacked chip-scale package technology in a package-on-package configuration that vertically combines more than one die. For example, stacked chip-scale packaging can be used with dies 24 and 38 to effectively double the memory capacity without changing the package size. Interconnections 52, 56 may be formed between bond pads (on each die 24, 38, respectively) and connection sites on die pad 22, which enable connection of dies 24 and 38 to the outside world. Interconnections 52, 56 may be thin wires attached to bonding pads and connection sites using a wire bonding technique that employs some combination of heat, pressure, and/or ultrasonic energy to make a weld.

Magnetic shields 36 and 48 may be integrated into semiconductor device 20 to protect dies 24 and 38 from external magnetic fields. Magnetic shields 36 and 48 may be formed of a metal having a relatively high magnetic permeability. One such metal having a high magnetic permeability may be an alloy including nickel and iron, such as the commercially available Mu-metal®. The high magnetic permeability metal is highly effective at screening static or low-frequency magnetic fields. High magnetic permeability metal can be provided in a sheet or foil format, which can be formed into shields 36 and 48, and then subsequently adhered to dies 24 and 38 utilizing any known method. Although an alloy including nickel and iron is discussed herein, it should be understood that other materials having relatively high magnetic permeability and that do not retain their magnetization upon the removal of the magnetic field may be used. Additionally, such material may be of a relatively soft magnetic material in some embodiments.

In some embodiments, magnetic shield 36 may be replaced with a component that functions solely as a spacer in the stacked configuration of semiconductor device 20 depicted in FIG. 1. For example, in a stacked device that has at least two dies, a spacer may be required to raise one of the dies slightly higher so that it will not touch the interconnecting wires from the lower die. In such embodiments, the principles of the present disclosure may be utilized with suitable spacer materials (e.g., a dielectric or insulator) to produce the necessary spacer component. Stated differently, those of ordinary skill in the art will readily recognize that the principles of the present disclosure may be used to manufacture any suitable semiconductor package components from any suitable material.

With reference now to FIG. 2, there is depicted a plan view of sheet 200 from which magnetic shields may be formed and singulated, according to one aspect of the present disclosure. In some embodiments, sheet 200 is a stock material including, e.g., a metal having a relatively high magnetic permeability. In some embodiments, the high magnetic permeability metal may be an alloy having nickel and/or iron, such as the commercially available Mu-metal® or Supermalloy. Further, sheet 200 may comprise of compounds including, e.g., nickel and/or iron (and/or alloys thereof). For example, sheet 200 may include a composite material having a magnetically conductive compound that includes about 79-80% nickel. In another example, the magnetically conductive compound, in lieu of the nickel or in addition thereto, includes about 15-16% iron. In yet another example, the conductive compound also may include about 5% molybdenum (Mo). To provide effective shielding, sheet 200 may have a thickness large enough to attract magnetic flux of an external magnetic field. In some embodiments, sheet 200 may include a thickness of about 0.125 mm to 0.160 mm.

With reference now to FIGS. 3A-3H, the steps of an exemplary manufacturing process for producing magnetic shields are illustrated, according to aspects of the present disclosure. The described manufacturing process produces singulated magnetic shields solely via a plurality of etching steps and without the need for steps involving mechanical separation by, e.g., sawing, cutting, grinding, and/or dicing. Furthermore, the described manufacturing process produces magnetic shields without debris or burrs protruding from the shields.

Those of ordinary skill in the art will readily recognize that the exemplary manufacturing processes and associated steps described herein are not limited to the production of magnetic shields for protecting magnetoresistive elements from stray or external magnetic fields. Instead, the described processes and steps may be used in conjunction with any manufacturing or packaging process for any semiconductor device or associated component.

With specific reference to FIG. 3A, there is depicted a portion of a cross-section of a sheet 200 of FIG. 2. As alluded to above, sheet 200 may include a stock shield material comprised of a metal having a relatively high magnetic permeability. One or more surfaces 200A, 200B of sheet 200 may have a mask pattern 302 deposited thereon. The mask pattern 302 may be deposited via any suitable process conventionally associated with photolithography manufacturing processes. For example, the mask pattern 302 may be contact (or proximity) printed onto top and bottom surfaces 200A, 200B of sheet 200. In some embodiments, mask pattern 302 may include a photoresist layer that protects underlying material (e.g., sheet 200) from subsequent cutting or treatment processes, such as, e.g., wet or dry etching processes. As shown in FIG. 3A, mask pattern 302 may leave certain portions of sheet 200 uncovered or otherwise exposed at windows 304.

Figure 3B:
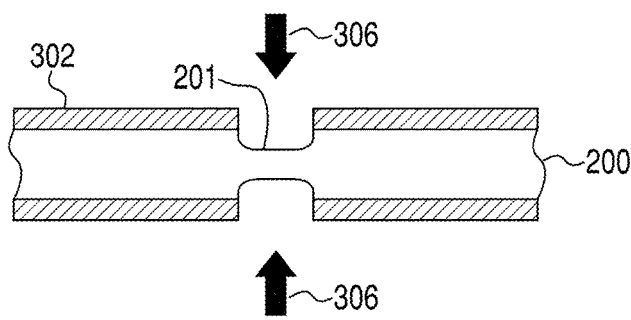

Turning now to FIG. 3B, the portions of sheet 200 exposed via windows 304 may be selectively removed via any suitable process. For example, as indicated by arrows 306, a suitable etching process (e.g., wet or dry etching) may be initiated at both the top and bottom surfaces 200A, 200B of sheet 200. However, those of ordinary skill in the art will readily recognize that an etching process 306 may be initiated at only of the top surface 200A or bottom surface 200B of sheet 200. For exemplary purposes, aspects of the present disclosure will be described herein in conjunction with etching processes 306 initiated at both the top and bottom surfaces 200A, 200B of sheet 200.

With continuing reference to FIG. 3B, one or both of etching processes 306 may be terminated before an entire thickness of sheet 200 is removed and/or before portions covered by mask pattern 302 are removed or otherwise affected. More specifically, one or both etching processes 306 may be terminated before material 201 is removed, leaving connected the two portions of sheet 200 on either side of material 201.

As alluded to above, the etching processes 306 may be any suitable etching processes known in the semiconductor manufacturing industry. For example, a wet etching process 306 may include isotropy or anisotropy etching performed with a suitable liquid or vapor etchant. In some embodiments, one or both of etching processes 306 may be replaced with dry etching process, such as, e.g., plasma etching, vapor phase etching, or reactive ion etching.

Figure 3C:
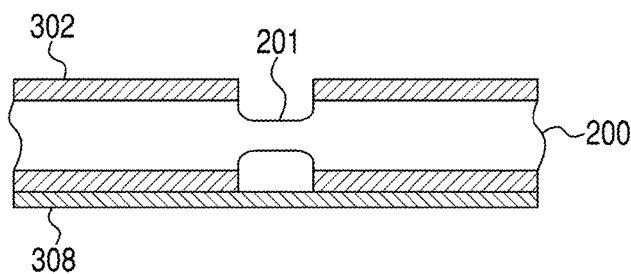

With material 201 connecting two adjacent portions of sheet 200, a suitable flexible backing layer 308 may be applied over the etched and masked portions of the bottom surface 200B of sheet 200, as shown in FIG. 3C. As will be explained in greater detail below, layer 308 may function to hold together shield portions 202A and 202B once material 201 is removed. In some embodiments, layer 308 may include a suitable tape, resistant to acid and heat, such as, e.g., a polyimide film. For example, layer 308 may include Kapton® Tape available from Dupont™. Layer 308 may be applied to sheet 200 by any suitable process known in the art.

Figure 3D:
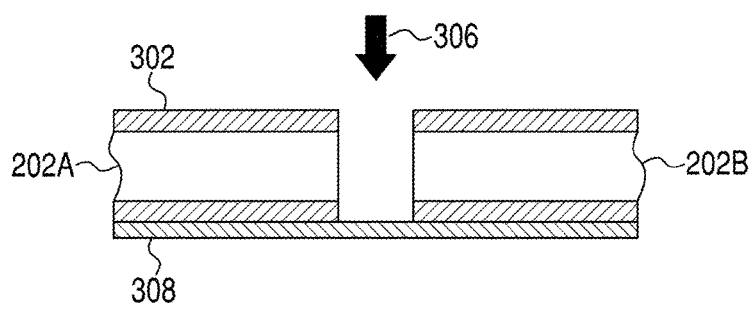

Turning now to FIG. 3D, a second etching process may be performed to remove remaining material 201, thereby separating shield portions 202A and 202B. The second etching process 306 may be substantially similar to the etching process(es) described above in connection with FIG. 3B. In some aspects, however, the etching process of FIG. 3D may be different from the etching process(es) described relative to FIG. 3B. For example, the etching process of FIG. 3D may utilize a different etchant. Regardless of the specific etching process utilized in FIG. 3D, the etching may be initiated via window 304 between mask pattern 302 on top surface 200A. The etching process 306 of FIG. 3D may completely remove all material 201 between shield portions 202A and 202B, thereby separating (or otherwise singulating) shield portions 202A and 202B. The process of FIG. 3D may produce separated magnetic shields without any residual debris or burrs. Because magnetic shields 202A and 202B are separated after the etching of FIG. 3D, flexible layer 308 may serve to hold the singulated shield portions 202A and 202B together.

Figure 3E:
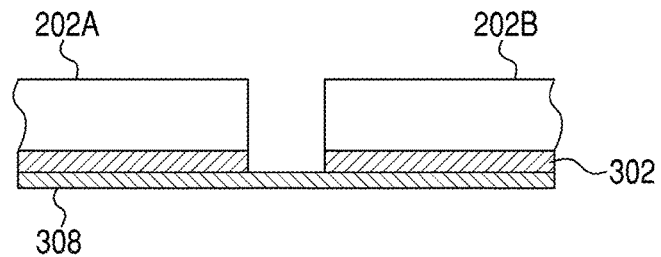

In FIG. 3E, mask pattern 302 may be removed from the top surfaces of the singulated magnetic shields 202A and 202B. The mask pattern 302 may be removed by any suitable process. In some aspects, solvents may be used to remove the mask pattern 302 from the top surfaces of the singulated magnetic shields 202A and 202B.

Figure 3F:
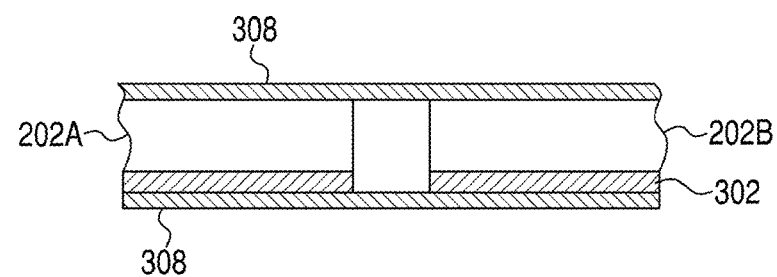
Figure 3G:
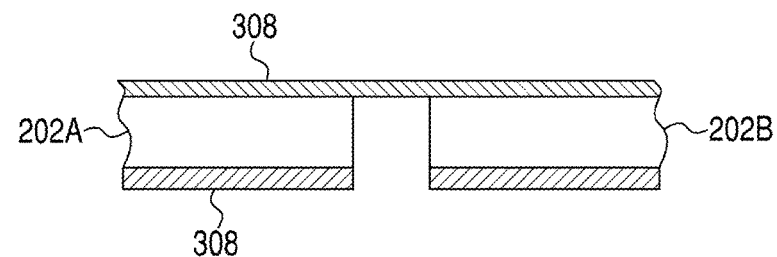
Figure 3H:
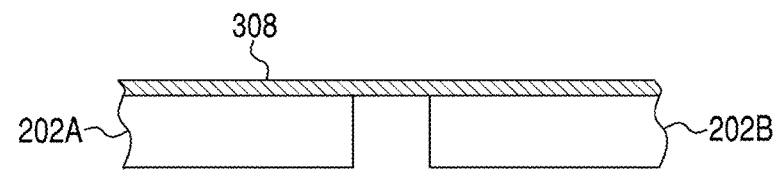

With reference to FIG. 3F, another flexible layer 308 may be applied to the top surface of singulated magnetic shields 202A and 202B. Flexible layer 308 may be substantially similar or different from the layer 308 described in connection with FIG. 3B. In FIG. 3G, flexible layer 308 may be removed from the bottom surface of the singulated magnetic shields 202A and 202B by any suitable process. In FIG. 3H, mask pattern 302 may be removed from the bottom surface of the singulated magnetic shields 202A and 202B. In some embodiments, solvents similarly may be used to remove the mask pattern 302 from the bottom surface of the singulated shields 202A and 202B. With magnetic shields 202A and 202B singulated and separated, the top flexible layer 308 serves to hold all of the singulated shields 202A and 202B together for use in additional semiconductor manufacturing processes.

With renewed reference to FIGS. 3A-3H, those of ordinary skill in the art will recognize that one or more of the described steps may be performed out of the described order or altogether omitted. In addition, the relative orientations of sheet 200 described herein are for discussion purposes only. Thus, in some embodiments, flexible layer 308 may be first applied to top surface 200A instead of bottom surface 200B. In such aspects, the etching process of FIG. 3D may be initiated from the window 304 on bottom surface 200B. The remaining steps of the described method may be similarly modified.

Figure 4:
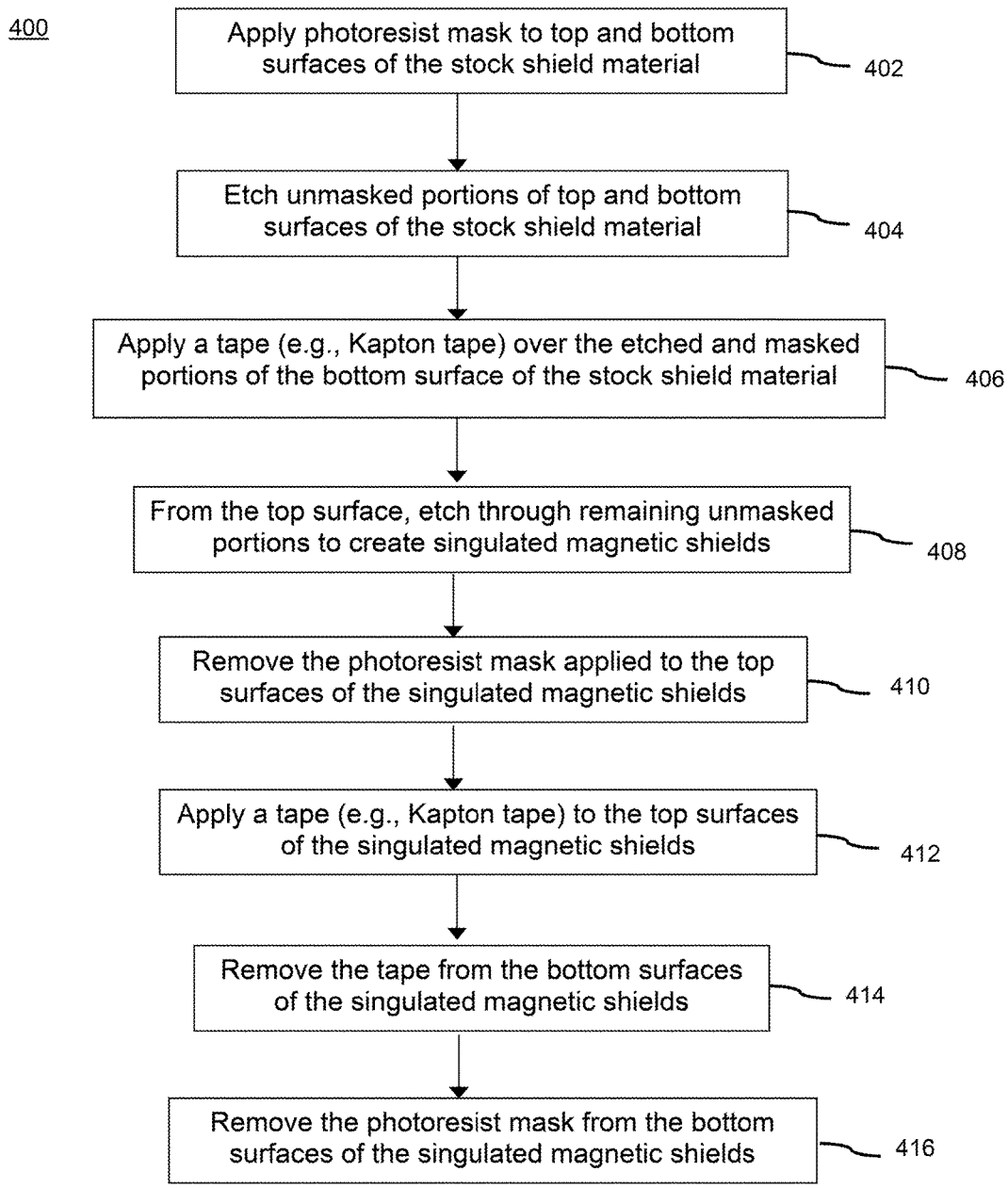
FIG. 4 depicts a flowchart of steps of an exemplary manufacturing process for producing magnetic shields, according to aspects of the present disclosure.

Turning now to FIG. 4, there is depicted a flowchart including steps of a manufacturing process 400 for producing magnetic shields singulated by a plurality of etching process. In some embodiments, the singulated magnetic shields may be produced solely via one or more etching processes. That is, the contemplated manufacturing process does not include any mechanical separation (e.g., cutting, sawing, grinding, etc.) of adjoining shields.

In step 402 of the manufacturing process 400, a photoresist mask may be applied to top and bottom surfaces of a stock shield material. As discussed above with reference to FIG. 2, the stock sheet material may be a metal having a relatively high magnetic permeability, such as an alloy including nickel and iron, or the commercially available Mu-Metal®. The application of the photoresist mask may leave certain portions of the stock shield material uncovered or otherwise exposed for subsequent etching, as shown in FIG. 3A. In step 404, the exposed areas of the stock sheet material may be selectively and partially removed by etching through the top surface and bottom surface of the stock shield material. In some embodiments, the etching processes of step 404 may be terminated before an entire thickness of the stock shield material is etched through, as shown in FIG. 3B. The etching process may be any suitable etching process known in the semiconductor manufacturing industry. Subsequent to the etching step, the stock shield material may undergo a rinse process that removes any residual etching agent used in the previous step.

In step 406, a tape, resistant to acid and heat, may be applied over the etched and masked portions of the bottom surface of the stock shield material, as shown in FIG. 3C. In some embodiments, the tape may be Kapton® Tape available from Dupont™. The tape may function to hold the singulated magnetic shields together once the remaining material is etched away. In step 408, the remaining portion of the stock sheet material may be etched away by a second etching process. In some embodiments, the second etching may be substantially similar to the etching process described above in connection with step 404. With the remaining material removed, the magnetic shields are formed and separated (or otherwise singulated). The singulated magnetic shields may undergo another rinse process to remove any residual etchants used in the previous step.

In step 410, the photoresist mask may be removed from the top surfaces of the singulated magnetic shields. In some embodiments, the photoresist mask may be removed by solvents, or by any suitable process. In step 412, another tape, resistant to acid and heat, may be applied to the top surfaces of the singulated magnetic shields. The tape may be substantially similar or different from the one applied in connection with step 406. In step 414, the tape may be removed from the bottom surfaces of the singulated magnetic shields. And, in step 416, the photoresist mask may be removed from the bottom surfaces of the singulated magnetic shields. As described above, the photoresist mask may be removed by solvents, or any suitable process. With the magnetic shields singulated and separated, the remaining tape (i.e., the tape applied to the top surfaces of the shields) serves to hold all of the singulated pieces together. While the disclosed method is described in connection with producing two singulated magnetic shields 202A and 202B (with reference to FIGS. 3D-3H), one of ordinary skill in the art will understand that the described steps may be scaled to produce a plurality of shields from a single sheet (e.g., sheet 200) of stock material.

Figure 5:
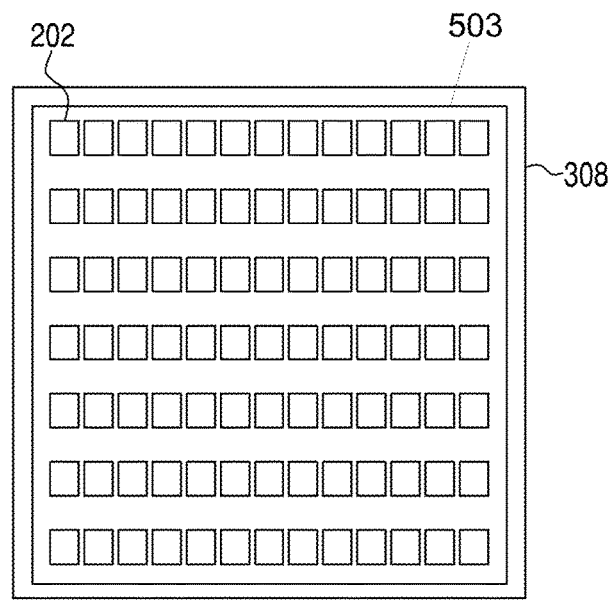
FIG. 5 depicts a plurality of singulated magnetic shields formed by an exemplary manufacturing process of the present disclosure.

With reference now to FIG. 5, there is depicted a planar view of singulated magnetic shields 202 held together by a flexible layer 308 and a sheet frame 503. In some embodiments, the flexible layer 308 may be the tape, resistant to acid and heat, described in connection with step 412 of manufacturing process 400. The sheet frame 503 may be an outer portion of the single sheet (e.g., sheet 200) of stock material that remains after the etching process(es) singulate and separate the magnetic shields. The singulated shields 202 may be held together by flexible layer 308, and the sheet frame 503 may provide structure for the flexible layer 308, for any suitable semiconductor manufacturing process, such as e.g., pick and place or other surface mount manufacturing. For example, the singulated magnetic shields 202 may be subsequently integrated into semiconductor devices having magnetoresistive elements for protection against external magnetic fields, or may be used as spacers in a stacked device (as described in connection with FIG. 1).

The present disclosure is drawn to, among other things, a method of forming a semiconductor shield from a stock material having a thickness. In some aspects the methods includes providing a first layer of material on a first surface of the stock material, wherein at least a portion of the first layer of material includes a first window that exposes a portion of the first surface; providing a second layer of material on a second surface of the stock material, wherein the second surface of the stock material is spaced from the first surface by the thickness of the stock material, and wherein at least portion of the second layer of material includes a second window that exposes a portion of the second surface; selectively removing a portion of the stock material exposed at the first or second windows, wherein the portion removed includes less than entirety of the thickness of the stock material; providing a first backing layer on the second layer of material; removing an entirety of the thickness of the stock material; removing a substantial entirety of the first layer of material; disposing a second backing layer on the first surface of the stock material; removing the first backing layer; and removing a substantial entirety of the second layer of material.

In various aspects, the described method(s) may include one or more of the following features: the first window and second window are disposed in a single plane extending perpendicularly to the first and second surfaces of the stock material; at least one of the first layer and the second layer includes a photoresist mask pattern; at least one of the first backing layer and the second backing layer includes a flexible tape; at least one of the first backing layer and the second backing layer includes a polyimide film; the step of selectively removing a portion of the stock material exposed at the first or second windows includes at least one etching process; the step of selectively removing a portion of the stock material exposed at the first or second windows includes removing stock material exposed at both the first and second windows; the step of selectively removing a portion of the stock material exposed at the first or second windows includes etching stock material exposed at both the first and second windows; the step of selectively removing a portion of the stock material exposed at the first or second windows comprises: a first etching process configured to remove stock material exposed at the first window and a second etching process configured to remove stock material exposed at the second window; the stock material includes nickel, iron, or an alloy thereof; at least one of the steps of removing a substantial entirety of the first or second layers of materials includes use of a solvent; the steps of removing a substantial entirety of the first and second layers of material includes removing an entirety of the first and second layers of material, respectively; and the thickness of the stock material is about 0.125 mm to about 0.160 mm.

In another aspect, the present disclosure is drawn to, among other things, a method of forming a plurality of singulated magnetic shields from a continuous stock material having a thickness. The method may include providing a first layer of material on a first surface of the stock material, wherein at least a portion of the first layer of material includes a first window that exposes a portion of the first surface, and wherein the stock material includes nickel, iron, or an alloy thereof; providing a second layer of material on a second surface of the stock material, wherein the second surface of the stock material is spaced from the first surface by the thickness of the stock material, and wherein at least portion of the second layer of material includes a second window that exposes a portion of the second surface; selectively removing a portion of the stock material exposed at the first and second windows, wherein the portion removed includes less than an entirety of the thickness of the stock material; securing a first flexible backing layer on the second layer of material; removing the entirety of the thickness of the stock material, thereby forming the plurality of singulated magnetic shields; removing an entirety of the first layer of material; securing a second flexible backing layer on the first surface of the stock material; removing the first backing layer; and removing an entirety of the second layer of material.

In various aspects, the described method(s) may include one or more of the following features: the first window and second window may be disposed in a single plane extending perpendicularly to the first and second surfaces of the stock material; at least one of the first layer and the second layer may include a photoresist mask pattern; the step of selectively removing a portion of the stock material exposed at the first and second windows may include etching stock material exposed at both the first and second windows; the step of selectively removing a portion of the stock material exposed at the first and second windows includes: a first etching process configured to remove stock material exposed at the first window and a second etching process configured to remove stock material exposed at the second window; at least one of the steps of removing an entirety of the first or second layers of materials may include use of a solvent; the thickness of the stock material may be about 0.125 mm to about 0.160 mm; and at least one of the first and second flexible backing layers may include a polyimide film.

The foregoing description of the inventions has been described for purposes of clarity and understanding. It is not intended to limit the inventions to the precise form disclosed. Various modifications may be possible within the scope and equivalence of the application.

We claim:

1. A method of forming a semiconductor shield from a stock material having a thickness, comprising:
    providing a first layer of material on a first surface of the stock material, wherein at least a portion of the first layer of material includes a first window that exposes a portion of the first surface;
    providing a second layer of material on a second surface of the stock material, wherein the second surface of the stock material is spaced from the first surface by the thickness of the stock material, and wherein at least portion of the second layer of material includes a second window that exposes a portion of the second surface;
    selectively removing a portion of the stock material exposed at the first or second windows, wherein the portion removed includes less than an entirety of the thickness of the stock material;
    providing a first backing layer on the second layer of material;
    removing an entirety of the thickness of the stock material;
    removing a substantial entirety of the first layer of material;
    disposing a second backing layer on the first surface of the stock material;
    removing the first backing layer; and
    removing a substantial entirety of the second layer of material.

2. The method of claim 1, wherein the first window and second window are disposed in a single plane extending perpendicularly to the first and second surfaces of the stock material.

3. The method of claim 1, wherein at least one of the first layer and the second layer includes a photoresist mask pattern.

4. The method of claim 1, wherein at least one of the first backing layer and the second backing layer includes a flexible tape.

5. The method of claim 1, wherein at least one of the first backing layer and the second backing layer includes a polyimide film.

6. The method of claim 1, wherein the step of selectively removing a portion of the stock material exposed at the first or second windows includes at least one etching process.

7. The method of claim 1, wherein the step of selectively removing a portion of the stock material exposed at the first or second windows includes removing stock material exposed at both the first and second windows.

8. The method of claim 1, wherein the step of selectively removing a portion of the stock material exposed at the first or second windows includes etching stock material exposed at both the first and second windows.

9. The method of claim 1, wherein the step of selectively removing a portion of the stock material exposed at the first or second windows comprises:
    a first etching process configured to remove stock material exposed at the first window; and
    a second etching process configured to remove stock material exposed at the second window.

10. The method of claim 1, wherein the stock material includes nickel, iron, or an alloy thereof.

11. The method of claim 1, wherein at least one of the steps of removing a substantial entirety of the first or second layers of materials includes use of a solvent.

12. The method of claim 1, wherein the steps of removing a substantial entirety of the first and second layers of material includes removing an entirety of the first and second layers of material, respectively.

13. The method of claim 1, wherein the thickness of the stock material is about 0.125 mm to about 0.160 mm.

14. A method of forming a plurality of singulated magnetic shields from a continuous stock material having a thickness, the method comprising:
    providing a first layer of material on a first surface of the stock material, wherein at least a portion of the first layer of material includes a first window that exposes a portion of the first surface, and wherein the stock material includes nickel, iron, or an alloy thereof;
    providing a second layer of material on a second surface of the stock material, wherein the second surface of the stock material is spaced from the first surface by the thickness of the stock material, and wherein at least portion of the second layer of material includes a second window that exposes a portion of the second surface;
    selectively removing a portion of the stock material exposed at the first and second windows, wherein the portion removed includes less than an entirety of the thickness of the stock material;
    securing a first flexible backing layer on the second layer of material;
    removing the entirety of the thickness of the stock material, thereby forming the plurality of singulated magnetic shields;
    removing an entirety of the first layer of material;
    securing a second flexible backing layer on the first surface of the stock material;
    removing the first backing layer; and
    removing an entirety of the second layer of material.

15. The method of claim 14, wherein the first window and second window are disposed in a single plane extending perpendicularly to the first and second surfaces of the stock material.

16. The method of claim 14, wherein at least one of the first layer and the second layer includes a photoresist mask pattern.

17. The method of claim 14, wherein the step of selectively removing a portion of the stock material exposed at the first and second windows includes etching stock material exposed at both the first and second windows.

18. The method of claim 14, wherein the step of selectively removing a portion of the stock material exposed at the first and second windows comprises:
    a first etching process configured to remove stock material exposed at the first window; and
    a second etching process configured to remove stock material exposed at the second window.

19. The method of claim 14, wherein at least one of the steps of removing an entirety of the first or second layers of materials includes use of a solvent.

20. The method of claim 14, wherein the thickness of the stock material is about 0.125 mm to about 0.160 mm.

* * * * *